United States Patent [19]

Collins et al.

[11] Patent Number: 4,916,438

[45] Date of Patent: Apr. 10, 1990

[54] BATTERY CHARGING, MONITORING AND ALARM CIRCUIT

[75] Inventors: Milton Collins, Northbrook; Roger A. Anderson, Addison, both of Ill.

[73] Assignee: Oneac Corporation, Libertyville, Ill.

[21] Appl. No.: 348,114

[22] Filed: May 4, 1989

Related U.S. Application Data

[63] Continuation of Ser. No. 109,574, Oct. 16, 1987, abandoned.

[51] Int. Cl.⁴ ............................................. G08B 21/00
[52] U.S. Cl. .................................... 340/636; 324/430; 320/48
[58] Field of Search ................ 340/636; 324/425, 426, 324/427, 430, 433, 435; 320/48, 43, 39, 21

[56] References Cited

U.S. PATENT DOCUMENTS

| | | | |
|---|---|---|---|
| 3,890,556 | 6/1975 | Melling et al. | 320/21 |
| 3,936,718 | 2/1976 | Melling et al. | 320/20 |
| 3,940,679 | 2/1976 | Brandwein et al. | 340/636 |
| 4,020,414 | 4/1977 | Paredes | 340/636 X |
| 4,097,803 | 6/1978 | Feldman | 324/432 |
| 4,147,969 | 4/1979 | Miller et al. | 320/2 |
| 4,193,026 | 3/1980 | Finger et al. | 324/428 |
| 4,290,002 | 9/1981 | Piotti | 320/20 |
| 4,302,714 | 11/1981 | Yefsky | 340/636 X |
| 4,308,817 | 1/1982 | Peterson | 116/215 |
| 4,313,060 | 1/1982 | Fickenscher et al. | 307/23 |
| 4,316,133 | 2/1982 | Locke, Jr. | 320/48 |
| 4,362,951 | 12/1982 | Turner et al. | 307/66 |
| 4,366,389 | 12/1982 | Hussey | 307/66 |
| 4,394,613 | 7/1983 | Cole | 340/636 X |
| 4,400,625 | 8/1983 | Hussey | 307/66 |
| 4,426,612 | 1/1984 | Wicnienski et al. | 320/39 |
| 4,433,294 | 2/1984 | Windebank | 320/48 X |
| 4,600,314 | 7/1986 | Theriault | 340/628 |
| 4,678,998 | 7/1987 | Muramatsu | 324/430 X |

Primary Examiner—Joseph A. Orsino
Assistant Examiner—Jeffery A. Hofsass
Attorney, Agent, or Firm—Mason, Kolehmainen, Rathburn & Wyss

[57] ABSTRACT

Methods and circuits are provided for monitoring a battery with the monitored battery electrically connected in an operating system. A dynamic impedance characteristic of the monitored battery is identified and compared with a predefined value. An alarm signal is generated responsive to the compared values to predict a degraded battery capacity. A leakage current value through the monitored battery is detected. An alarm signal is generated responsive to the detected leakage current value to predict a short life expectancy for the monitored battery. Visual and audible alarms are generated responsive to either of the generated alarm signals after the monitored battery has been fully charged. An alarm signal is immediately generated responsive to a detected charging current value above a predetermined value.

8 Claims, 2 Drawing Sheets

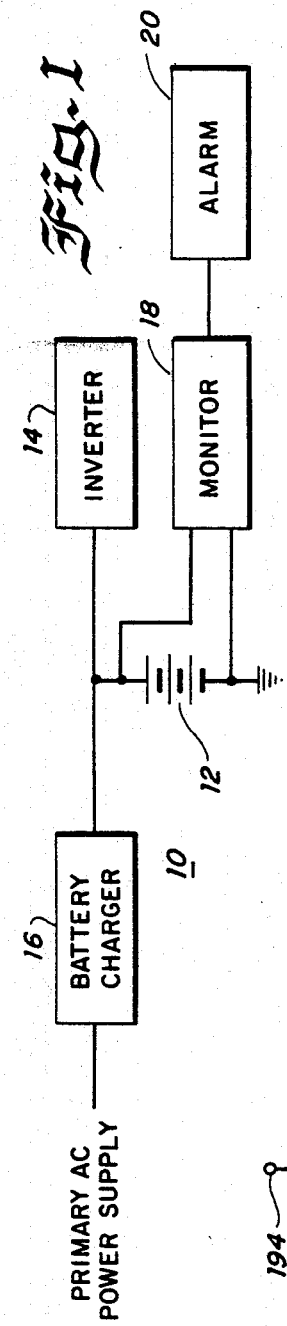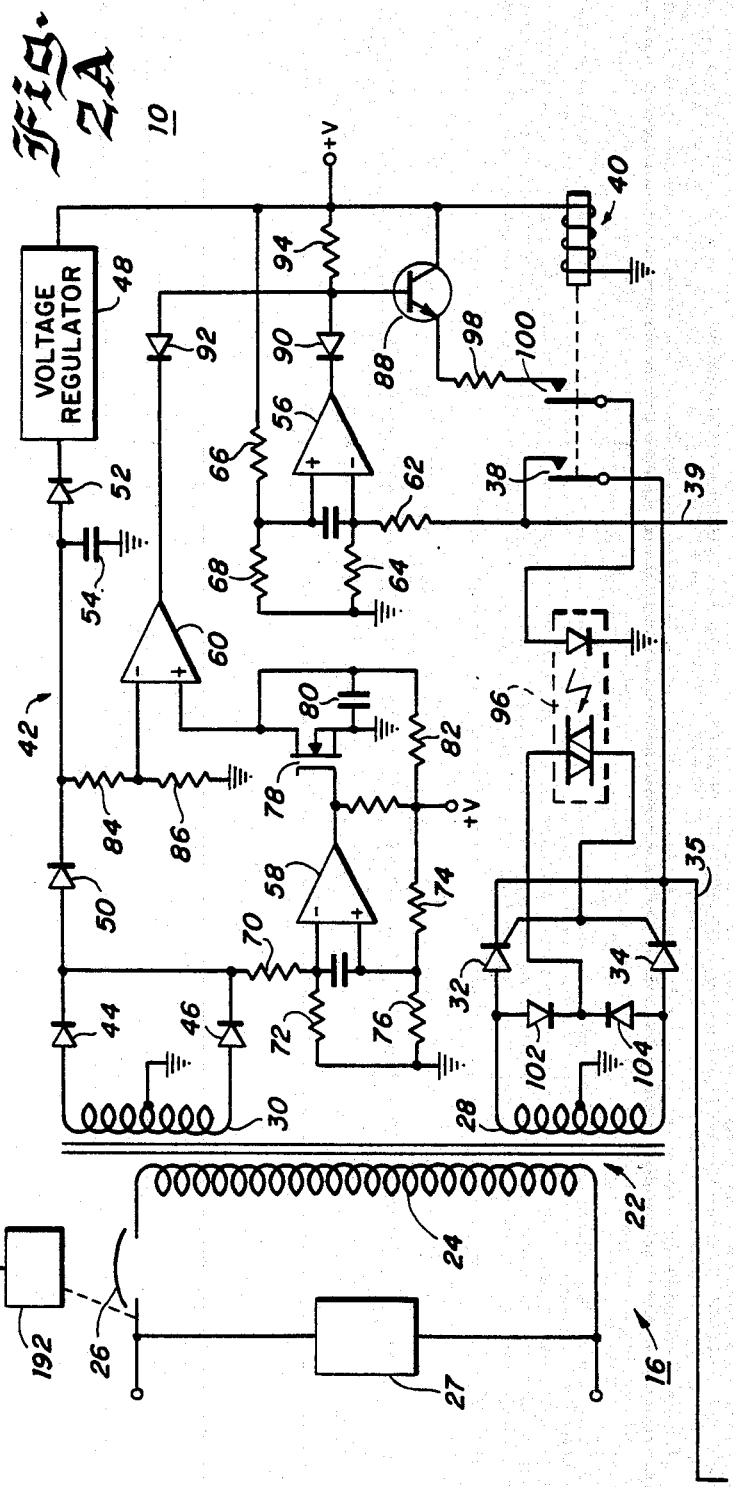
Fig. 1
Fig. 2A

BATTERY CHARGING, MONITORING AND ALARM CIRCUIT

This application is a continuation of application Ser. No. 109,574, filed Oct. 16, 1987, now abandoned.

BACKGROUND OF THE INVENTION

1. Field of the Invention

The present invention relates to battery monitoring circuitry and more particularly, to charging, monitoring and alarm circuitry to predict both degraded battery capacity and short life expectancy of a monitored battery.

2. Description of the Prior Art

In a standby power system, typically the back-up battery will not be used for extended periods of time. However, it is essential that the battery be capable of delivering sufficient energy to the load when required. Accordingly, it is important to monitor the battery to determine when the battery should be replaced.

Various arrangements and techniques are known for charging and testing batteries used for various applications. For example, U.S. Pat. No. 4,426,612 discloses a constant current battery charging and testing circuit for determining the state of charge of the battery by closing a switch to place a current sink across the battery, sensing the battery voltage and comparing the sensed voltage with a reference voltage.

U.S. Pat. No. 4,316,133 discloses a battery charging circuit for continuously charging a back-up battery. The charging circuit produces a charging current which is a function of both the temperature and the battery voltage. Testing is provided by placing a test load across the battery effectively removed from the charging circuit, sensing the battery voltage and comparing the sensed voltage with a reference voltage.

Typically, reliability of the battery is determined by such manual testing arrangements and/or by frequent periodic battery replacement. It is important to provide a battery monitoring arrangement that is automatic and that eliminates the need for manual intervention.

SUMMARY OF THE INVENTION

Among the important objects of the present invention are to provide a new and improved method and circuit for monitoring a battery to predict a degraded battery capacity; to provide a new and improved method and circuit for monitoring a battery to predict a short life expectancy of the battery; to provide such methods and circuits enabling effective and reliable operation and providing a warning for battery replacement; and to provide such methods and circuits to guarantee battery reliability and that avoids one or more of the disadvantages of prior art arrangements.

In brief, these and other objects and advantages of the invention are provided by methods and circuits for monitoring a battery with the monitored battery electrically connected in an opening circuit. A dynamic impedance characteristic of the monitored battery is identified and compared with a predefined value. An alarm signal is generated responsive to the compared values to predict a degraded battery capacity. A leakage current value through the monitored battery is detected. An alarm signal is generated responsive to the detected leakage current value to predict a short life expectancy for the monitored battery. Visual and audible alarms are generated responsive to either of the generated alarm signals after the monitored battery has been fully charged. An alarm signal is immediately generated responsive to a detected charging current value above a predetermined value.

BRIEF DESCRIPTION OF THE DRAWINGS

These and other objects and advantages of the present invention will become readily apparent upon consideration of the following description and attached drawing wherein:

FIG. 1 is a block diagram representation of a standby battery power supply system including a battery charging, monitoring and alarm circuit in accordance with the principles of the present invention:

FIGS. 2A–2B together provide a schematic diagram representation of the battery charging, monitoring and alarm circuit of FIG. 1.

DETAILED DESCRIPTION OF THE PREFERRED EMBODIMENT

Figure 2B:
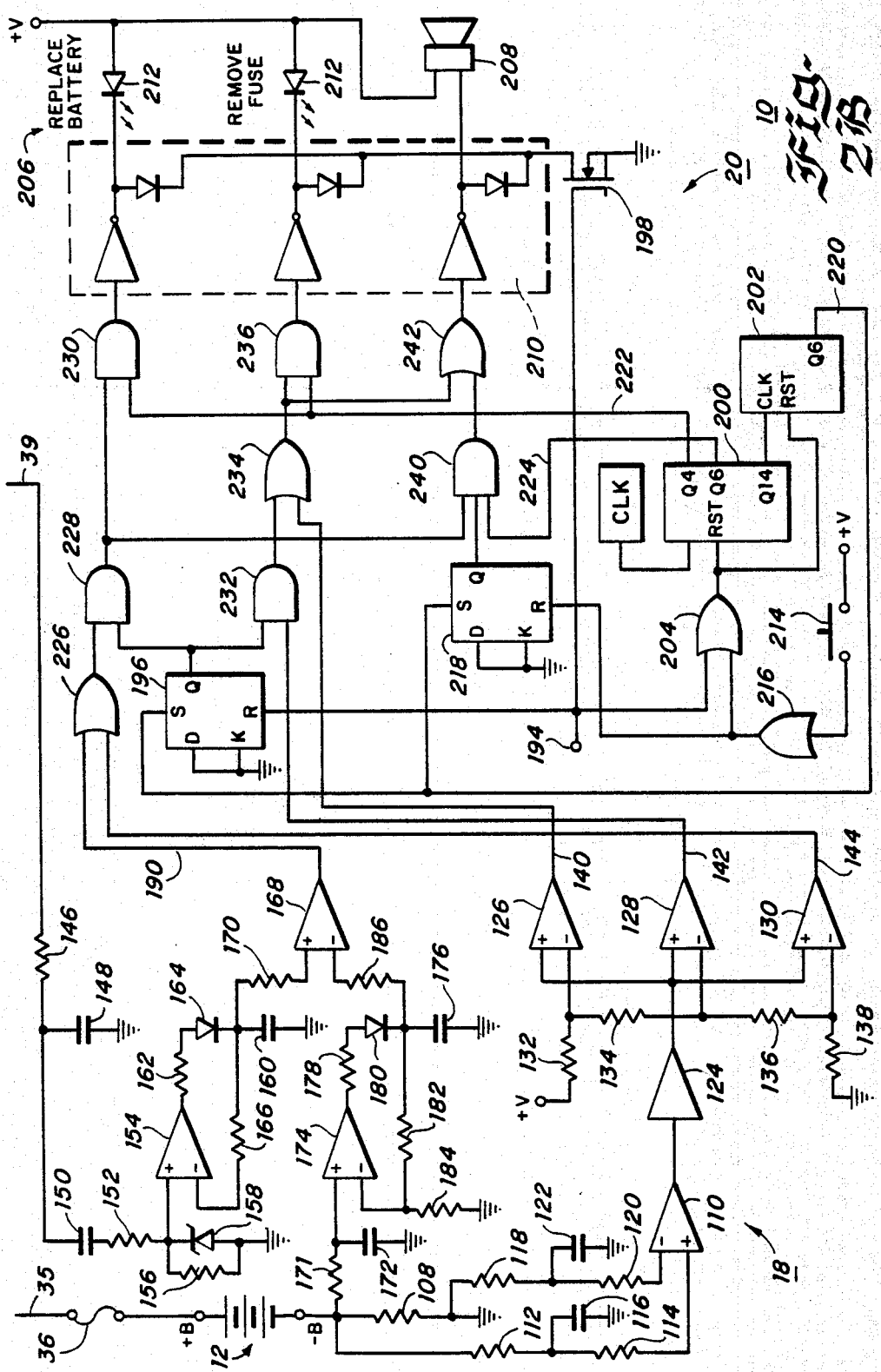

The present invention provides a battery charging, monitoring and alarm circuit to predict a degraded battery capacity and a short life expectancy for a monitored battery. For purposes of illustration the invention is described in connection with a standby power supply system, but it should be understood that the principles of the invention are not limited to this system.

Referring now to the drawing and initially to FIG. 1, there is shown a block diagram representation of a standby power supply system designated in its entirety by the reference character 10. The standby power supply system 10 includes a storage battery 12 for supplying power to an inverter 14 for converting from DC to AC for supplying a load (not shown) during a power loss of the primary AC power supply. The standby power supply system 10 further includes a battery charging circuit 16 for charging the storage battery 12, a monitoring circuit 18 for monitoring the battery 12 and an alarm circuit 20 for providing visual and audible signalling for the user of the system 10.

The storage battery 12 is, for example, a 24 cell lead-acid battery having a nominal cell voltage of 2 volts to provide an overall battery voltage of 48 volts nominal. The charging circuit 16 provides current pulses at a maximum rate of twice the primary AC power supply frequency. The charging circuit 16 supplies the charging current required by the battery 12 without overcharging the battery. The leakage current and the dynamic impedance of the battery 12 are measured and compared to acceptable characteristic values for the particular battery by the monitoring circuit 18. The leakage current is the average net difference between the charging and discharging current through the battery 12 when the battery is fully charged. After a predetermined time delay of sufficient duration to fully charge the battery 12, the charging current and dynamic impedance comparisons are utilized to generate visual and audible alarms indicative of battery degradation.

Referring to FIG. 2A, the battery charging circuit 16 includes a charging transformer 22 having its primary winding 24 connected to the primary AC power supply lines through a temperature responsive switch 26. A noise suppressor circuit 27 is connected across the primary winding 24. The charging transformer 22 includes a pair of center-tapped secondary windings 28 and 30. A pair of semiconductor controlled rectifiers (SCR's) 32 and 34 is enabled or gated on for supplying charging current from the winding 28 to the battery 12. Each of the SCR's 32 and 34 is connected at its anode to a respective opposite end of the winding 28. Secondary winding 28 supplies, for example, 50 volts RMS or 70 volts peak to the anodes of SCR's 32 and 34. The cathodes of the SCR's 32 and 34 are connected together at a line 35 and connected to positive terminal of the battery 12 via a fuse 36, as shown in FIG. 2B.

A first normally open contact pair 38 provides a monitoring connection to the positive terminal of the battery 12 via the line 35 and fuse 36. During the charging operation of the battery charging circuit 16 contacts 38 are closed. Contacts 38 are opened to effectively disconnect the battery 12 from the charging circuit 16 during a power outage of the primary AC power supply. The normally open contacts 38 are relay contacts of a relay 40 energized by a DC reference voltage +V obtained by way of the primary AC power supply.

A gating control circuit of the charging circuit 16 is generally designated by the reference character 42. Gating signals for enabling the SCR's 32 and 34 are provided by the gating control circuit 42. The gating control circuit 42 senses the positive terminal battery terminal +B via the line 35 and the fuse 36. A sensed positive battery voltage at a line 39 is used by the gating circuit 42 to maintain a selected minimum or float voltage of the battery 12. A pair of rectifiers 44 and 46 is connected to the secondary winding 30 for full-wave rectification of the secondary AC voltage. DC voltage is provided by a voltage regulator device 48 connected to the cathode of the rectifier 44 via a pair of series connected rectifiers 50 and 52 with a filtering capacitor 54 connected between ground and the junction of rectifiers 50 and 52. An integrated circuit regulator device type 7812ACT can be used for the voltage regulator device 48. The DC reference voltage +V, such as, for example, +12 volts is provided by the regulator device 48.

A first comparator 56 controls battery charging to maintain the selected minimum or float voltage of the battery 12, for example 55.5 volts. Current limiting to avoid overheating of the charging transformer 22 is provided by a second and a third comparator 58 and 60 of the gating control circuit 42. Current limiting is provided through phase control of the gating signals for the SCR's 32 and 34. An integrated circuit dual comparator device type LM393 can be used for the comparators 56, 58 and 60.

A voltage divided signal corresponding to the sensed battery voltage at the line 39 is applied to the first comparator 56. A pair of voltage divider resistors 62 and 64 is connected between the line 39 and ground and is connected at their junction to an inverting input of the comparator 56. A second pair of voltage divider resistors 66 and 68 is connected between the DC reference voltage +V and ground and at their junction to a non-inverting input of the comparator 56. When the battery voltage is below the selected float voltage, the voltage at the inverting input is less than the voltage at the non-inverting input, so that the output of the comparator 56 is positive. During initial charging after the battery 12 has been discharged, the comparator 56 provides a positive output until the selected battery float voltage is achieved. Then the comparator 56 periodically provides a positive output when the battery voltage decays below the float voltage.

A voltage divided signal from the unregulated voltage output of the rectifiers 44 and 46 is applied to an inverting input of the comparator 58 via a pair of voltage divider resistors 70 and 72. A selected low reference voltage is provided to the non-inverting input of the second comparator 58 from +V through a pair of voltage divider resistors 74 and 76. Near the zero crossing of the rectifiers' output voltage, the output of the comparator 58 produces a positive pulse that is applied to the gate of a metal oxide semiconductor field effect transistor (MOSFET) 78. A capacitor 80 is connected across the source and drain of the MOSFET 78 and in series with a resistor 82 connected to the DC reference voltage +V, as shown. A non-inverting input of the comparator 60 is connected at the junction of the series-connected capacitor 80 and resistor 82. A voltage divided signal from the unregulated voltage output of the rectifiers 44 and 46 is applied to an inverting input of the comparator 60 via a pair of voltage divider resistors 84 and 86. An NPN bipolar transistor 88 is connected at its base to the outputs of the comparators 56 and 60 via respective diodes 90 and 92, as shown. A biasing resistor 94 is connected between the +V and the transistor base and the anodes of diodes 90 and 92.

The phase control operation of the comparators 58 and 60 is provided as follows. The capacitor 80 is discharged by each positive output pulse of the comparator 58 resulting near the zero crossings of the output voltage of rectifiers 44 and 46. Capacitor 80 then charges during each half cycle through the resistor 82 to apply a ramp voltage to the non-inverting input of the comparator 60. The reference voltage applied to the inverting input of comparator 60 is proportional to the incoming AC supply. A positive output of the comparator 60 results after the charging time delay provided by the combination of capacitor 80 and resistor 82.

Transistor 88 is arranged as an emitter follower with its collector connected to a +V and its emitter connected to an opto-isolator device 96 via a series connected resistor 98 circuit and a second pair of normally open contacts 100 of the relay 40. An integrated opto-isolator device type MOC3010 can be used for the opto-isolator device 96. A pair of diodes 102 and 104 is connected at their respective anodes across the opposite ends of the secondary winding 28. The cathodes of the diodes are connected together and to the opto-isolator 96 to supply gate drive energy to the SCR's 32 and 34. The base of transistor 88 is driven positive only by a positive output of both comparators 56 and 60, its emitter follows to provide an SCR gating pulse output through the opto-isolator device 96.

Referring to FIG. 2B, the monitoring circuit 18 of the invention will now be described. A resistor 108 is connected between the negative battery terminal −B and ground for monitoring current through the battery 12. The resistor 108 has a value, for example, of 0.01 ohms so that the charging current results in a small voltage potential across the resistor 108. Current through the battery 12 is measured by the monitoring circuit 18 including an operational amplifier 110 having a high gain, for example, of 100. Operational amplifier 110 has a first input connected to the junction of battery 12 and the resistor 108 through a filtering circuit of a pair of series connected resistors 112 and 114 with a capacitor 116 connected between their junction and ground. A second input of the amplifier 110 is connected to the ground connection of resistor 108 via a similarly arranged pair of resistors 118 and 120 and a capacitor 122. The operational amplifier 110 is arranged as a differential amplifier for common mode signal rejection with conventional biasing circuitry (not shown).

The amplified output of the amplifier 110 is applied through a unity gain isolation amplifier 124 to the non-inverting input of a plurality of comparators 126, 128 and 130. An integrated circuit operational amplifier device LM358N can be used for the isolation amplifier 124 and the comparators 126, 128 and 130. A voltage divider arrangement of resistors 132, 134, 136 and 138 is connected in series between +V and ground. The inverting input of comparators 126, 128 and 130, respectively, is connected to the junction of resistors 132 and 134, 134 and 136, and 136 and 138 for providing selected reference voltages. When the amplified current representative signal applied to the non-inverting input is greater than the reference voltage, a positive output signal of the respective comparator 126, 128 and 130 results at a line labelled 140, 142 and 144. For example, a positive output signal at the line 140, 142 and 144 corresponds to a current value greater than 5 amperes, 1 ampere and 0.1 ampere, respectively.

Dynamic impedance of the battery 12 is monitored by the monitoring circuit 18 including a filter combination of a resistor 146 and a capacitor 148 connected to the line 39 for sensing the peak battery voltage. A coupling capacitor 150 is connected in series with a resistor 152 between the junction of resistor 146 and capacitor 148 and the non-inverting input of an operational amplifier 154 to isolate the DC battery voltage. A biasing resistor 156 and a zener diode 158 are connected in parallel between ground and the non-inverting input to provide a reference to ground. Zener diode 158 clamps the input voltage to protect the amplifier 154 from overvoltage. The output of amplifier 154 is applied to a capacitor 160 through a series connected resistor 162 and diode 164. A feedback resistor 166 is connected between the inverting input and the junction of the diode 164 and capacitor 160. The detected peak voltage output signal is applied to the non-inverting input of a comparator 168 through a resistor 170 connected to the junction of diode 164 and capacitor 160.

A filter combination of a resistor 171 and a capacitor 172 is connected to the junction of the resistor 108 and the negative battery terminal −B for sensing the peak battery current. The non-inverting input of an operational amplifier 174 is connected to the junction of the series connected resistor 171 and capacitor 172. The output of the operational amplifier 174 is applied to a capacitor 176 through a series connected resistor 178 and diode 180. A feedback resistor 182 is connected from the junction of the diode 180 and capacitor 176 to both a resistor 184 and the inverting input of amplifier 180, as shown. The operational amplifier 174 is thus arranged to provide an amplified or scaled output, for example, by a gain of 31. The scaled output of the operational amplifier 174 representing the detected peak charging current is applied to the inverting input of the comparator 168 through a resistor 186 connected to the junction of the diode 180 and capacitor 176. Operational amplifiers 154 and 174 and comparator 168 can be implemented with the integrated circuit operational amplifier device LM358N. Comparator 168 provides a ratio comparison of the detected peak voltage and the detected peak current to identify the dynamic impedance of the battery 12. When the dynamic impedance of battery 12 exceeds a characteristic value of, for example, 0.3 ohms the detected peak voltage signal applied to the non-inverting input of comparator 168 will be higher than the detected peak charging current signal applied to the inverting input. This results in positive output of the comparator 168 to indicate an unacceptably high dynamic impedance of the battery 12.

A positive output signal of the comparator 168 at a line 190 is utilized by the alarm circuit 20 to indicate that battery replacement is needed.

Referring to FIG. 2A, the monitoring circuit 18 further includes a supply line detector 192 for providing a positive output pulse at line 194 when the standby power supply system 10 is first installed on power-up connection to the primary AC power supply. The supply line detector 192 provides a positive output pulse at the line 194 responsive to the arrival of the primary AC power supply resetting the standby power supply system 10 to normal operation.

Referring again to FIG. 2B, the alarm circuit 20 will now be described. The alarm circuit 20 receives the output signals of the monitoring circuit 18 at the lines 140, 142, 144, 190 and 194. An output signal at the line 140 corresponding to the exemplary charging current of greater than 5 amperes immediately is used for generating an alarm. The power present pulse signal at the line 194 starts a predetermined time delay period before the output signals at the lines 142, 144 and 190 are utilized for generating alarms. A fully charged battery condition is identified corresponding to this predetermined time period. The power present signal at the line 194 is applied to a reset input of a D-type flip-flop (F/F) 196 and to a gate input of a MOSFET 198 of the alarm circuit 20. The power present signal at the line 194 is applied to a reset input of both a first counter/oscillator device 200 and a second counter device 202 via a dual input OR gate 204. An integrated circuit 14-bit binary counter and oscillator device MC14060 can be used for the counter 200 with an integrated circuit 7-stage ripple counter device MC14024 used for the counter/oscillator 202. The counter/oscillator 200 and counter 202 are arranged together to provide the predetermined time delay, such as, for example, 4 hours.

The MOSFET 198 is connected to a display 206 and an audible alarm 208 through a parallel diode output of an inverting buffer driver 210. An integrated circuit device ULN2804 can be used for the buffer driver 210. The display 206 includes a plurality of light emitting diodes (LED's) 212 for providing warning indications to the user, such as REPLACE BATTERY and REMOVE FUSE. The MOSFET 198 is enabled by the power present signal at its gate providing a current path for the LED's 212 and the audible alarm 208 for an initial visual and audible indication of proper operation.

A momentary switch 214 is provided for manual operation to temporarily inhibit the audible alarm 208. The switch 214 is connected between the +V and a dual input OR gate 216. A positive output of OR gate 216 resulting from the manual operation of the switch 214 is applied to both the second input of OR gate 204 and a reset of a D-type F/F 218. The counters 200 and 202 are reset by the resulting positive output of the OR gate 204. A clock signal having a selected frequency is derived from a selected output of the counter/oscillator 200 and is applied to the clock input of the counter 200. A selected output of the counter 200 provides a clock input for the counter 202. After the counters 200 and 202 are reset, an output pulse at a line labelled 220 is provided at a selected output of the counter 202 following the exemplary 4-hour predetermined time delay.

The output pulse at the line 220 is applied to the set input of the F/F 196.

A first selected output of the counter 200 provides a square wave of low repetition rate at a line labelled 222 used for alternately enabling an alarm indication by a particular LED 212. A second selected output of the counter 200 similarly provides a square wave output at a line labelled 224 for alternately enabling the audible alarm 208.

After the predetermined time delay period, the REPLACE BATTERY warning indication is generated when either the leakage current is greater than 0.1 amperes or the battery impedance is greater than 0.3 ohms or both conditions occur. Output signals indicating a leakage current greater than 0.1 amp at line 144 and battery impedance greater than 0.3 ohm at line 190 are applied to a dual input OR gate 226. The output of OR gate 226 is applied to an input of a dual input AND gate 228. The Q-output of the F/F 196 is applied to the other input of AND gate 228 so that the REPLACE BATTERY alarm is inhibited during the exemplary 4-hour predetermined time delay period. The output of AND gate 228 is applied to an input of a dual input AND gate 230. The low repetition square wave at line 222 is applied to the other input of the AND gate 230. The output of AND gate 230 is operatively coupled to the REPLACE BATTERY LED 212 via the driver circuit 210.

After the predetermined time delay period, the REMOVE FUSE warning indication is generated when the leakage current is greater than 1 ampere. The REMOVE FUSE warning indication is immediately generated when the charging current is greater than 5 amperes. The output signal indicating a leakage current greater than 1 ampere at line 142 is applied to an input of a dual input-AND gate 232. The Q-output of the F/F 196 is applied to the other input of AND gate 232 to provide the exemplary 4-hour time delay period. The output of AND gate 232 is applied to an input of a dual input OR gate 234. The output signal indicating a current greater than 5 amperes at line 140 is applied to the other input of OR gate 234. The output of OR gate 234 is applied to an input of a dual input AND gate 236. The square wave signal at line 222 is applied to the other input of AND gate 236. The output of AND gate 236 is operatively coupled to the REMOVE FUSE LED 212 via the driver circuit 210.

An audible alarm signal is generated with both the REPLACE BATTERY and REMOVE FUSE visual warning indications. The predetermined time delay pulse output of counter 202 at line 220 is applied to the set input of the F/F 218 that is reset by the output pulse of OR gate 216 resulting from the operation of the switch 214. The output of AND gate 228 also is applied to a three input AND gate 240. The Q-output of F/F 218 is applied to the second input of the AND gate 240. The square wave signal at line 224 is applied to the remaining input of AND gate 240. The output of AND gate 240 is applied to an input of a dual input OR gate 242 with the output of OR gate 234 applied to its other input. The output of OR gate 242 is operatively coupled to the audible alarm 208 via the driver circuit 210.

The audible alarm 208 sounds in a pulsed mode in synchronism with the slow square wave signal at line 224 in response to a REPLACE BATTERY alarm condition. The audible alarm 208 is temporarily silenced by the manual operation of the switch 214 which also resets the counters 200 and 202. After the exemplary 4-hour delay period, the signal at line 220 enables the pulsed mode of the audible alarm 208 in response to a REPLACE BATTERY alarm condition. When a REMOVE FUSE alarm condition occurs, the audible alarm 208 sounds in a constant mode until the fuse 36 is removed.

Although the present invention has been described in connection with details of the preferred embodiment, many alterations and modifications may be made without departing from the invention. Accordingly, it is intended that all such alterations and modifications be considered within the spirit and scope of the invention as defined in the appended claims.

What is claimed and desired to be secured by Letters Patent of the United States is:

1. A circuit for monitoring a battery to predict a degraded battery capacity with the battery electrically connected in a standby power operating system, the circuit comprising:
   charging means for periodically providing a charging current pulse to the monitored battery;
   first means for identifying a fully charged battery condition;
   means responsive to said first means for detecting a dynamic impedance characteristic of the monitored battery, said dynamic impedance detecting means including:
   means responsive to said charging current pulse for detecting a peak voltage across the monitored battery,
   means responsive to said charging current pulse for detecting peak current through the monitored battery, and
   ratio comparator means for comparing said detected peak voltage with said detected peak current to identify said dynamic impedance characteristic;
   means for comparing said identified dynamic impedance characteristic with a predefined value; and
   means responsive to said comparator means for generating an alarm signal.

2. A circuit for monitoring a battery as recited in claim 1 further includes:
   means responsive to both said generated alarm signal and said identified fully charged battery condition for generating a visual alarm indication.

3. A circuit for monitoring a battery as recited in claim 2 further includes:
   means responsive to both said generated alarm signal and said identified fully charged battery condition for generating an audible alarm.

4. A circuit for monitoring a battery as recited in claim 1 wherein said means for identifying a fully charged battery condition include:
   means for identifying a predetermined time period, said predetermined time period being identified after both an initial power-up and resetting connection of the circuit to a primary AC power supply system, said predetermined time period being provided of sufficient duration for fully charging the monitored battery.

5. A circuit for monitoring a battery as recited in claim 1 wherein said means for identifying a fully charged battery condition include:
   means for detecting charging current through the monitored battery; and
   means for identifying said detected charging current below a predetermined value.

6. A circuit for monitoring a battery as recited in claim 2 further includes:
   manually operable means coupled to said visual alarm indication generating means for inhibiting said generated visual alarm indication;
   timing means responsive to said manually operable means for starting a predefined delay time period before enabling said generated visual alarm.

7. A circuit for monitoring a battery as recited in claim 3 further includes:
   manually operable means coupled to said audible alarm generating means for inhibiting said generated audible alarm;
   timing means responsive to said manually operable means for starting a predefined delay time period before enabling said generated audible alarm.

8. A circuit for monitoring a battery to predict a degraded battery capacity and to predict a short life expectancy for the battery with the battery electrically connected in a standby power operating system, the circuit comprising:
   means for identifying a fully charged battery condition;
   means for detecting current through the monitored battery;
   comparator means for comparing said detected current with a plurality of predetermined values to identify a leakage current value;
   means for detecting a dynamic impedance characteristic of the monitored battery, said means for detecting a dynamic impedance characteristic of the monitored battery including charging means for providing a charging current pulse to the monitored battery, means responsive to said charging current pulse for detecting a peak voltage across the monitored battery; means responsive to said charging current pulse for detecting peak current through the monitored battery, and ratio comparator means for comparing said detected peak voltage with said detected peak current to identify said dynamic impedance characteristic;
   means for comparing said identified dynamic impedance characteristic with a predefined value; and
   means responsive to said identified fully charged battery condition for generating an alarm signal responsive to said compared dynamic impedance characteristic and said detected leakage current value.

* * * * *